(12) United States Patent
Nam et al.

(10) Patent No.: US 6,302,962 B1
(45) Date of Patent: Oct. 16, 2001

(54) DIFFUSION SYSTEM HAVING AIR CURTAIN FORMATION FUNCTION FOR MANUFACTURING SEMICONDUCTOR DEVICES AND METHOD OF CONTROLLING THE SAME

(75) Inventors: Ki-heum Nam, Suwon; Yang-koo Lee, Kwachun, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/336,751

(22) Filed: Jun. 21, 1999

(30) Foreign Application Priority Data

Jun. 23, 1998 (KR) .................................................. 98-23771

(51) Int. Cl.⁷ .................................................. C23C 16/00
(52) U.S. Cl. ........................ 118/696; 118/704; 118/715; 118/724
(58) Field of Search ................................. 118/715, 696, 118/704, 724

(56) References Cited

U.S. PATENT DOCUMENTS

| | | | |
|---|---|---|---|
| Re. 33,326 | * 9/1990 | Ebata | 118/719 |
| 5,110,248 | * 5/1992 | Asano | 118/719 |

FOREIGN PATENT DOCUMENTS

| | | | |
|---|---|---|---|
| 62-290126 | * 12/1987 | (JP) | 118/715 |
| 63-239938 | * 10/1988 | (JP) | 118/715 |
| 1-262628 | * 10/1989 | (JP) | 118/715 |

* cited by examiner

*Primary Examiner*—Richard Bueker
(74) *Attorney, Agent, or Firm*—Jones Volentine, PLLC

(57) ABSTRACT

A diffusion system for manufacturing semiconductor devices has an air curtain formed across a furnace opening for preventing the loss of heat energy from inside the furnace. The diffusion system includes the furnace having an opening through which a wafer boat having a plurality of wafers is loaded/unloaded; an air curtain apparatus for spraying a gas across the opening so as to form an air curtain cutting off the atmosphere inside of the furnace from the outside environment; and a controlling unit for controlling the air curtain apparatus by applying on/off signals to the air curtain apparatus. The diffusion system is controlled by the controlling unit so as to form the air curtain at the opening of the furnace while the wafer boat moves in and out of the furnace. After the wafer boat is completely loaded into the furnace, the air curtain is removed.

16 Claims, 10 Drawing Sheets

DIFFUSION SYSTEM HAVING AIR CURTAIN FORMATION FUNCTION FOR MANUFACTURING SEMICONDUCTOR DEVICES AND METHOD OF CONTROLLING THE SAME

BACKGROUND OF THE INVENTION

1. Field of the Invention

The present invention relates to a diffusion system having an air curtain formation function for manufacturing semiconductor devices and a method of controlling the same, and more particularly, to a diffusion system having an air curtain formation function for preventing the loss of the heat inside the diffusion furnace by cutting off the loss of the heated air flow, and a method of controlling the same.

2. Background of the Related Art

Generally, semiconductor devices are manufactured by carrying out various fabrication processes repeatedly, and there are many types of main facility systems and supplementary facility systems for preforming these processes.

Among the various processes, a diffusion process includes an oxidation step for forming an oxide layer, and an annealing step for activating or stabilizing impurities such as boron (B) or phosphorus (P), which are implanted to provide electrical characteristics, etc.

The main facility system for the diffusion process is a furnace, which comprises a quartz tube and a heating chamber including a heater to heat the quartz tube; and the furnace has an opening for entry and removal of wafers.

In addition, a supplementary facility system for the furnace includes a process gas supplying unit for supplying a certain amount of process gas into the chamber; a boat elevator for loading/unloading a wafer boat having a plurality of wafers therein to the furnace; a wafer transfer unit for loading/unloading the wafers to the wafer boat; and a controlling unit for controlling the above components mechanically, etc.

After the wafer boat is loaded into the furnace through the opening, and the diffusion process is completed, the wafer boat is unloaded from the furnace through the opening, and the wafers loaded in the wafer boat are moved into a wafer transfer apparatus, such as a cassette, which will be moved to another fabrication system for a subsequent process.

Then, additional wafers to be processed are loaded into the wafer boat, the wafer boat is loaded into the furnace through the opening, and the diffusion process is carried out inside the furnace.

Generally, the furnace is continuously heated to maintain a constant temperature inside while the wafer boat is loaded or unloaded through the open opening. In addition, heaters are installed in some sections inside the furnace (e.g., upper section, middle section, lower section) to heat each respective section inside the furnace separately and maintain a uniform temperature throughout all sections. In addition, to control the temperature of the heater in each section of the furnace, there is provided a thermocouple (T/C) in each section inside the furnace.

However, in the conventional furnace, heated air flows out of the furnace through the open opening while the wafer boat is loaded/unloaded and the wafers therein are transferred, so that a large amount of heated air flow is lost through the opening, and the temperature uniformity is seriously deteriorated around the opening of the furnace. As a result, non-uniform thickness layers are formed on the semiconductor substrate due to the deteriorated temperature uniformity.

Therefore, in an effort to solve the problem, the temperature of the heater around the opening is raised to compensate for the temperature drop around the opening due to the flow of heated air through the opening. Alternatively, a cut-off door is installed to close a portion of the opening when the wafer boat has completely exited the furnace.

However, the conventional methods used to raise the temperature of the heater around the opening results in deterioration of the inner resistance of the heater, and a large amount of heat energy is still wasted because the loss of heated air is not prevented. Also, time is lost in compensating for the loss of the heated air flow and raising the inner temperature around the opening during the diffusion process.

In addition, while a cut-off door may close the opening and shut off the heated air flow coming out of the furnace while the wafer boat is completely removed from the opening, it cannot shut off the heated air flow while the wafer boat is being loaded or unloaded through the opening. In addition, the cut-off door is designed in a non-contact manner in order to prevent the generation of particles, and therefore, it can only partially shut off the heated air flow even when the cut-off door is in the closed position. Therefore, the cut-off door fails to stop the flow of heated air out of the furnace.

SUMMARY OF THE INVENTION

The present invention is directed to a diffusion system having an air curtain formation function for manufacturing semiconductor devices, and a method of controlling the same, for maintaining a uniform inner temperature inside a furnace. This uniform temperature improves the uniformity of the layers formed on a semiconductor substrate, increases the endurance of the furnace, and reduces the time for the temperature recovery, thereby improving the production yield of semiconductor devices.

To achieve these and other advantages and in accordance with the purpose of the present invention, as embodied and broadly described, the diffusion system having an air curtain formation function comprises a furnace having an opening through which a wafer boat having a plurality of wafers is loaded/unloaded; an air curtain apparatus for spraying a gas across the opening so as to form an air curtain cutting off the atmosphere inside of the furnace from the outside environment; and a controlling unit for controlling the air curtain apparatus by applying an on/off signal to the air curtain apparatus.

In addition, the air curtain apparatus may comprise a gas source for storing gas at a high pressure; a gas supply line in communication with the gas source; and a spray nozzle for spraying the gas supplied from the gas supply line at a high pressure.

In addition, a gas valve is provided on the gas supply line for opening/closing the gas supply line, and the controlling unit has a series of programs preset therein so as to control the gas valve by applying an on/off signal to the gas valve. A preheater may be further provided on the gas supply line for preheating the gas.

In addition, a plurality of spray nozzles are provided along the inside periphery of the opening at a constant interval such that the sprayed gas forms gas flow lines that traverse the opening in parallel and in one direction.

Alternatively, a plurality of spray nozzles are provided along the inside periphery of the opening such that the sprayed gas flow from one side of the opening traverses the opening from one side without conflicting with the sprayed gas flow from spray nozzles on the other side of the opening.

Alternatively, a plurality of spray nozzles may be provided along the inside periphery of the opening to spray the gas across the opening from all directions such that lattice-like gas flow traces are formed.

Alternatively, a plurality of spray nozzles may be radially provided along the inside periphery of the opening at a constant interval so as to spray gas toward the center of the opening.

In addition, the air curtain apparatus may further comprise an intake port for taking in the gas sprayed from the spray nozzle; a vacuum pump spaced apart from the intake port and forming a vacuum pressure therein; and a gas intake line connecting the vacuum pump and the intake port. In addition, the spray nozzle may be long, narrow and slit-shaped and formed on the end of the gas supply line.

Furthermore, the spray nozzles in each of the embodiments of the present invention are formed to spray gas upward toward the inside of the furnace at a certain angle.

In another aspect of the present invention, the method of controlling the diffusion system having an air curtain formation function may comprise the steps of forming an air curtain around an opening of a furnace by the operation of a controlling unit after the diffusion process has completed inside the furnace; moving a wafer boat out of the furnace with the air curtain formed and present; unloading wafers from the wafer boat with the air curtain still present; loading wafers to be processed onto the wafer boat with the air curtain still present; moving the wafer boat into the furnace with the air curtain still present; and removing the air curtain by the control of the controlling unit when the wafer boat is completely loaded inside the furnace.

It is to be understood that both the foregoing general description and the following detailed description are exemplary and explanatory and are intended to provide further explanation of the invention as claimed.

BRIEF DESCRIPTION OF THE ATTACHED DRAWINGS

These and other objects, features and advantages of the present invention will be described with reference to the accompanying drawings. In the drawings:

FIG. 1 schematically shows a diffusion system having an air curtain formation function for manufacturing semiconductor devices according to the present invention;

Figure 12:
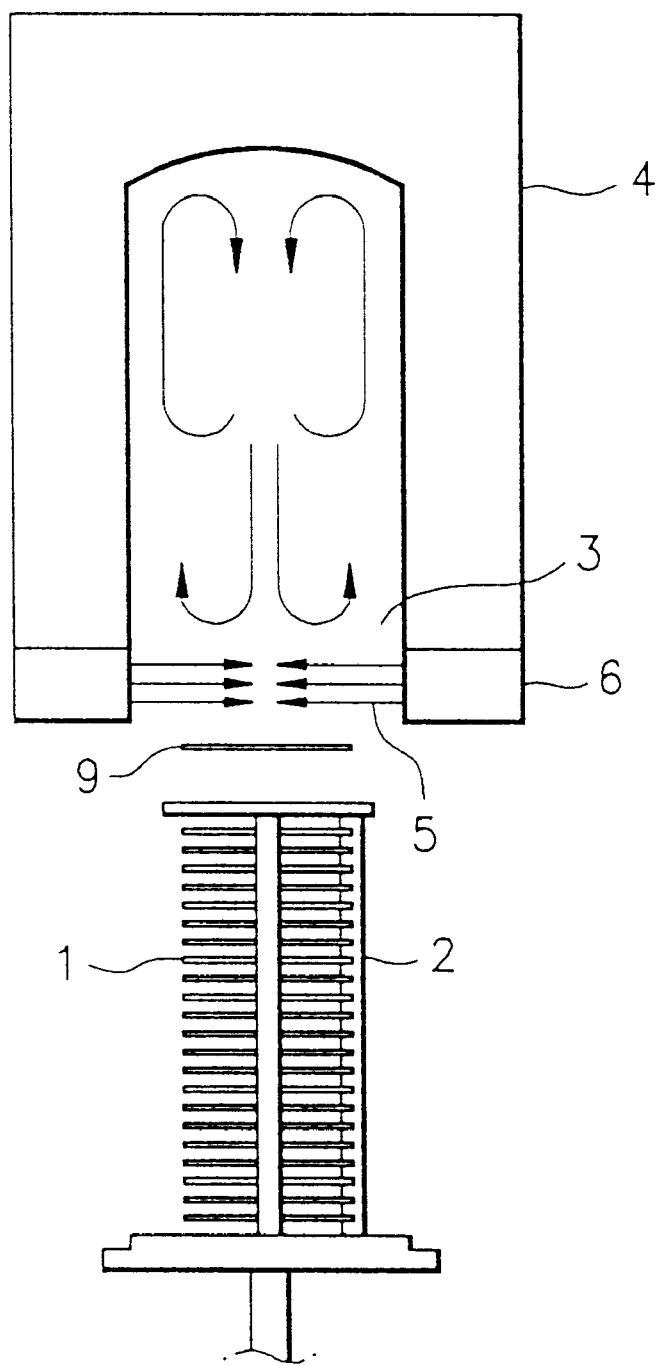
Figure 13:
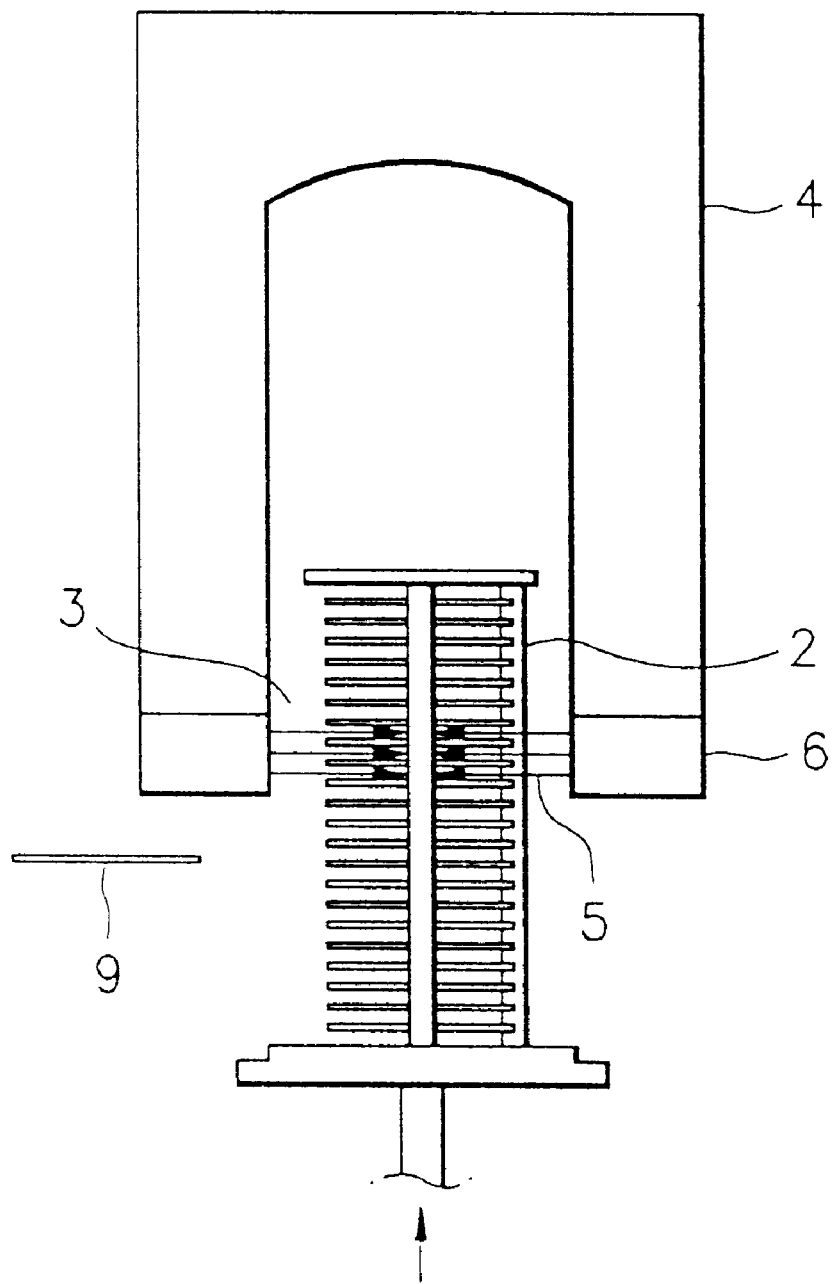
Figure 14:
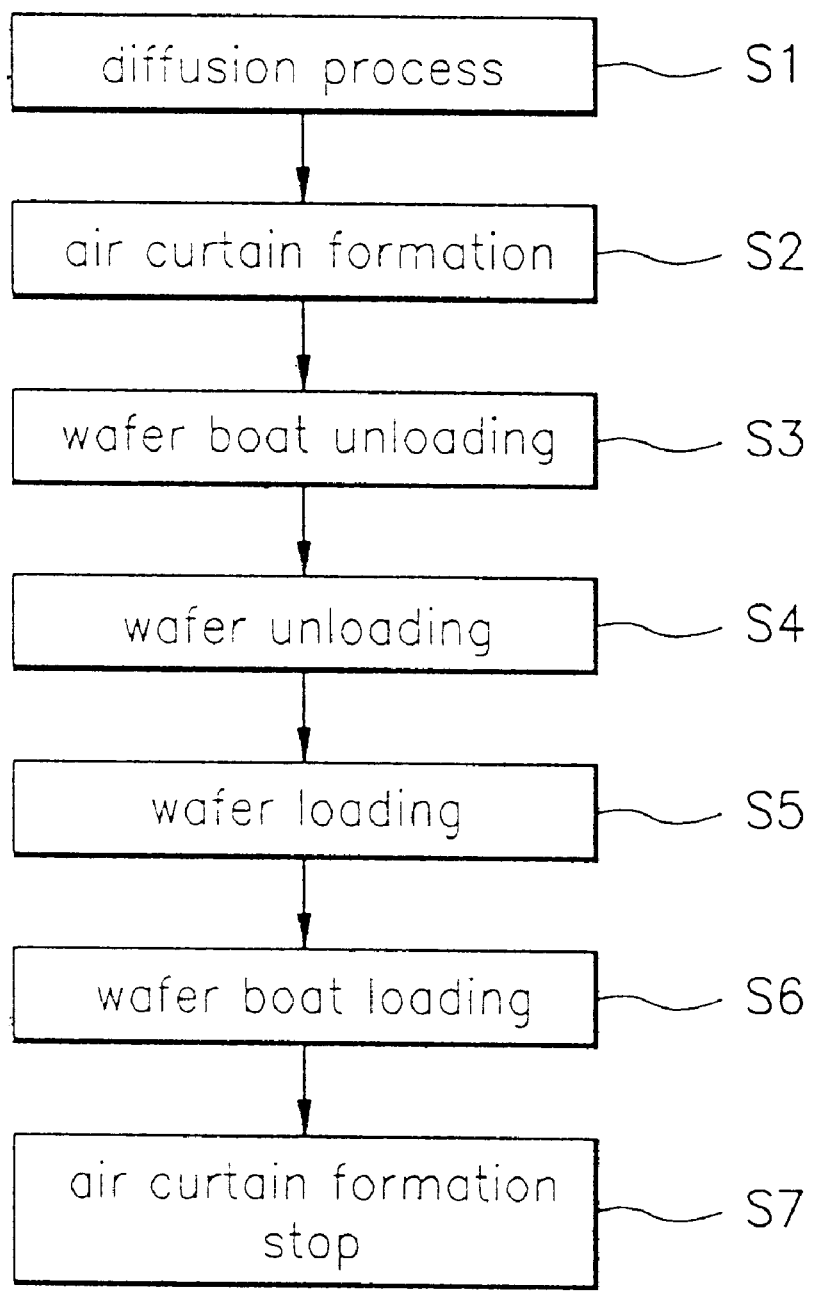

FIGS. 9 to 13 schematically and sequentially show the operation steps in the diffusion system having an air curtain formation function for manufacturing semiconductor devices according to the present invention; and FIG. 14 is a flow chart depicting the operation steps of the diffusion system having an air curtain formation function for manufacturing semiconductor devices according to the present invention.

DETAILED DESCRIPTION OF THE PREFERRED EMBODIMENT

Preferred embodiments of the present invention will now be described in detail with reference to the accompanying drawings.

Figure 1:
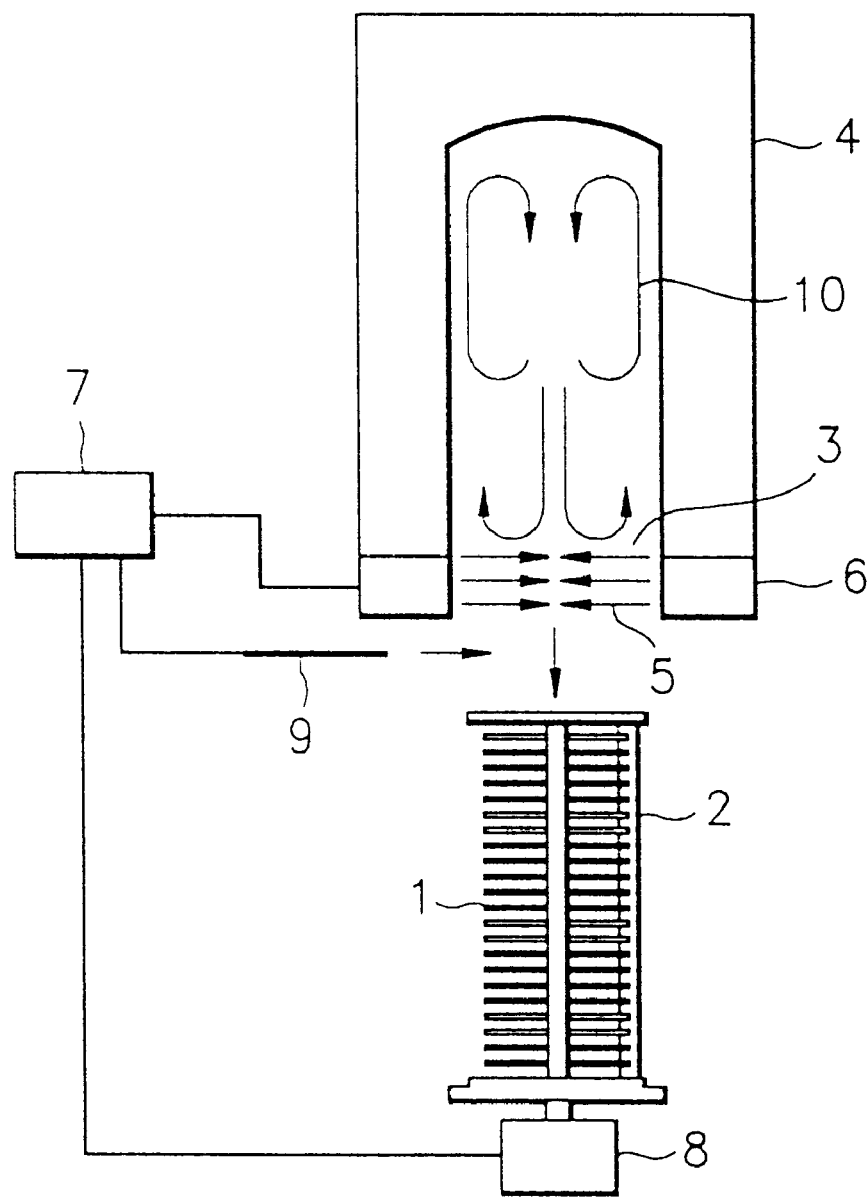

Referring to FIG. 1, the diffusion system comprises a furnace 4 having an opening 3 through which a wafer boat 2 having a plurality of wafers 1 is loaded/unloaded; an air curtain apparatus 6 for spraying gas across the opening 3 so as to form an air curtain 5 to isolate the atmosphere inside of the furnace 4 from the outside environment; and a controlling unit 7 for controlling the air curtain apparatus 6 by applying an on/off signal thereto.

In the construction as above, the controlling unit 7 also controls a boat elevator 8 to move the wafer boat 2 into/out of the furnace 4 by applying a loading/unloading signal to the boat elevator 8.

In addition, when the wafer boat 2 moves down and exits the opening 3, a cut-off door 9 closes some portion of the opening 3 as driven by the controlling unit 7.

When the wafer boat 2 with wafers 1 is loaded inside the furnace, and the diffusion process is completed, the controlling unit 7 applies an on-signal to the air curtain apparatus 6 so as to spray the gas, and form an air curtain across the opening 3. While the air curtain 5 is present across the opening 3, the wafer boat 2 is unloaded out of the furnace 4 through the opening 3 by the operation of the boat elevator 8.

At this time, the air curtain 5 keeps the heated air inside the furnace 4 circulating only inside the furnace 4 as shown in FIG. 1, so that the inner temperature of the furnace 4 is maintained at a uniform level.

When the wafer boat 2 exits from the opening 3, and is completely unloaded, the cut-off door 9 closes one part of the opening 3 in order to prevent the heated air flow 10 from exiting the opening 3. The cut-off door 9 is controlled by the controlling unit 7, which has a series of control programs therein.

At this time, the air curtain 5 is still formed across the opening 3, and the wafers 1 loaded in the wafer boat 2 are unloaded into another fabrication system for a subsequent process, or into a wafer transfer apparatus such as a cassette, etc.

Then, another group of wafers 1 supplied for the diffusion process are loaded into the wafer boat 2, and after the cut-off door 9 is opened, the wafer boat 2 is supplied into the furnace 4 through the open opening 3 by the boat elevator 8. Then, the controlling unit 7 applies an off-signal to the air curtain apparatus 6 so as to stop the air curtain 5 from forming across the opening 3.

Therefore, according to the structure of the prevent invention, while the opening 3 of the furnace 4 is open, the heated air flow 10 inside the furnace 4 is prevented from coming out of the furnace 4 so as to maintain the inner temperature of the furnace 4 uniformly. Therefore, the temperature recovery for improving the temperature uniformity can be made promptly, and it is not necessary to supply extra energy for recovery of the heat energy loss.

At this point, the controlling unit 7 controls the boat elevator 8, the cut-off door 9 and the air curtain apparatus 6 according to a program already preset therein by an input apparatus. A sensor may also be provided on one side of the furnace 4 to control the air curtain apparatus 6 for sensing the location of the boat elevator 8 and the cut-off door 9.

Various modifications or alterations to the controlling unit 7 can be made within the scope and the spirit of the present invention, which are apparent to those skilled in the art.

Figure 2:
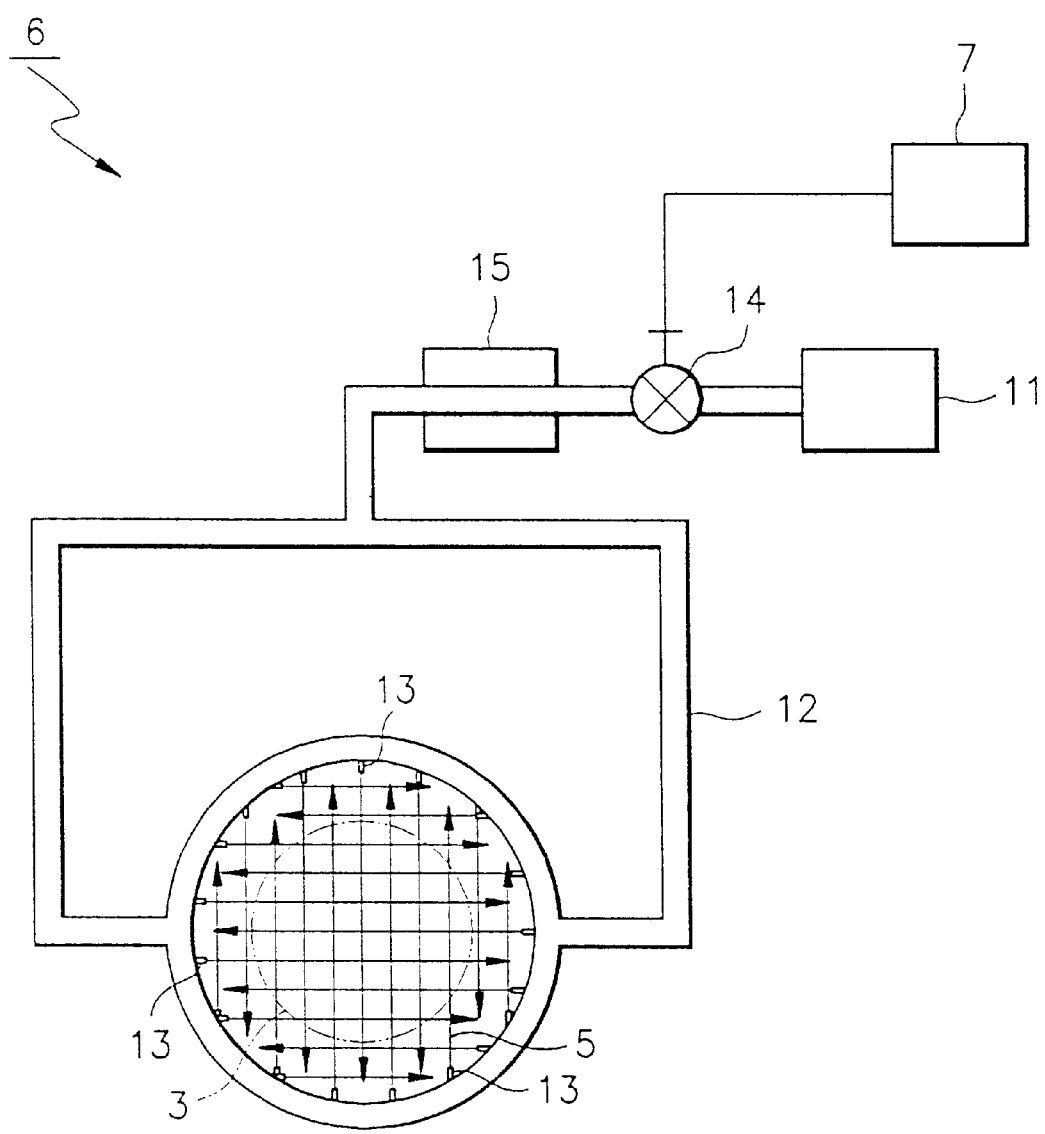
FIG. 2 is a plan view showing an air curtain apparatus according to one preferred embodiment of the present invention.

The air curtain apparatus 6 of the present invention comprises, as shown in FIG. 2, a gas source 11 for storing gas at a high pressure, a gas supply line 12 in communication with the gas source 11, and a plurality of spray nozzles 13 for spraying the gas supplied through the gas supply line 12 at a high pressure.

The air curtain apparatus 6 further comprises a gas valve 14 provided on the gas supply line 12 for opening/closing the gas supply line 12, and the controlling unit 7 having a series of preset programs to control the air curtain apparatus 6 by applying an on/off signal to the gas valve 14.

In addition, on the gas supply line 12, there is provided a preheater 15 to preheat the gas such that the temperature of the gas does not affect the heated air flow inside the furnace 4 so as to maintain the temperature of the heated air flow substantially uniform.

The preheater 15 can be controlled by the controlling unit 7 such that the supplied gas maintains a specific temperature, or using another controller such as a thermocouple, etc., the specific temperature can be maintained.

So, if the gas valve 14 is opened by the controlling unit 7, and gas is introduced through the gas supply line 12, the gas is sprayed through the spray nozzles 13 after being preheated by the preheater 15 so as to form the air curtain 5.

In addition, if an off-signal is applied from the controlling unit 7 to close the gas valve 14, the air curtain 5 is removed. The gas supplied in the air curtain apparatus 6 for forming the air curtain 5 is preferably an inert gas such as nitrogen ($N_2$) gas so as to prevent damage to the wafer.

In addition, according to the present invention, a plurality of spray nozzles 13 are provided along the inside periphery of the opening 3 to spray the gas across the opening 3 from all directions. The spray nozzles are arranged in groups around the inside periphery, such that the spray nozzles spray parallel lines of gas. In this arrangement, gas flows in a pattern of straight, parallel lines from all around the inside periphery of the opening, forming lattice-like gas flow traces as shown in FIG. 2. The groups of spray nozzles are spaced or offset from each other. In this way, the gas flows formed by the sprayed gas from the spray nozzles 13 traverse the opening 3, and cross each other without conflicting with each other, thereby improving the cut-off effect on the heated air flow 10.

Figure 3:
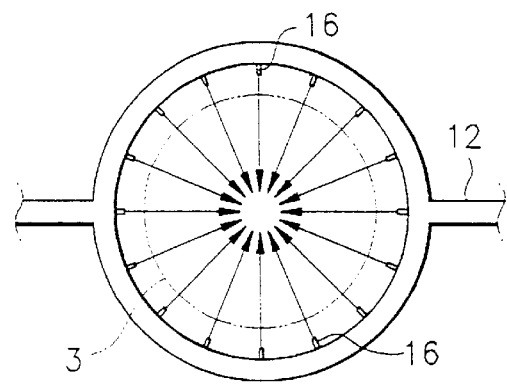
FIGS. 3 to 5 are plan views showing the various alternative embodiments of the spray nozzles shown in FIG. 2.
Figure 4:
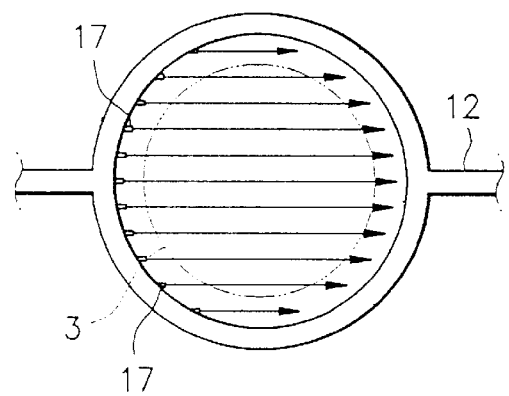
Figure 5:
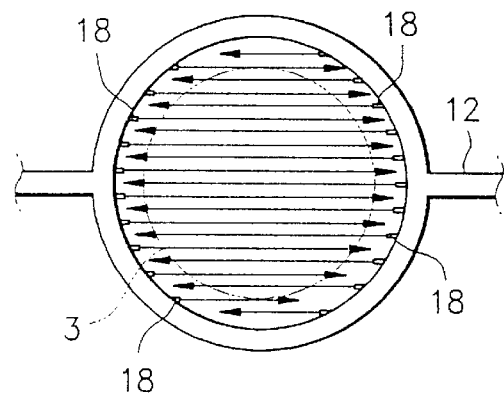

Alternatively, as shown in FIG. 3, a plurality of spray nozzles 16 are provided along the inside periphery of the opening 3, spaced at a constant interval and directed so as to spray gas radially toward the center of the opening 3. Or, a plurality of spray nozzles 17 can be provided on only one side covering approximately half of the inside periphery of the opening 3, spaced at a constant interval and directed so as to spray parallel lines of gas, such that the sprayed gas flows directly in only one direction traversing the opening 3, as shown in FIG. 4. Or, as shown in FIG. 5, a plurality of spray nozzles 18 can be provided on both sides of the inside periphery of the opening 3, spaced at a constant interval and directed so as to spray parallel lines of gas, but the spray nozzles on one side of the opening are spaced or offset from those on the other side of the opening. Therefore, the sprayed gas flows traverse the opening 3 from both sides without conflicting with each other. In order to further reduce the chance of any obstruction of the air flows, the spray nozzles can also be spaced or offset in the vertical direction (see FIG. 1) so that the gas flows from opposing nozzles flow in different horizontal planes.

Figure 6:
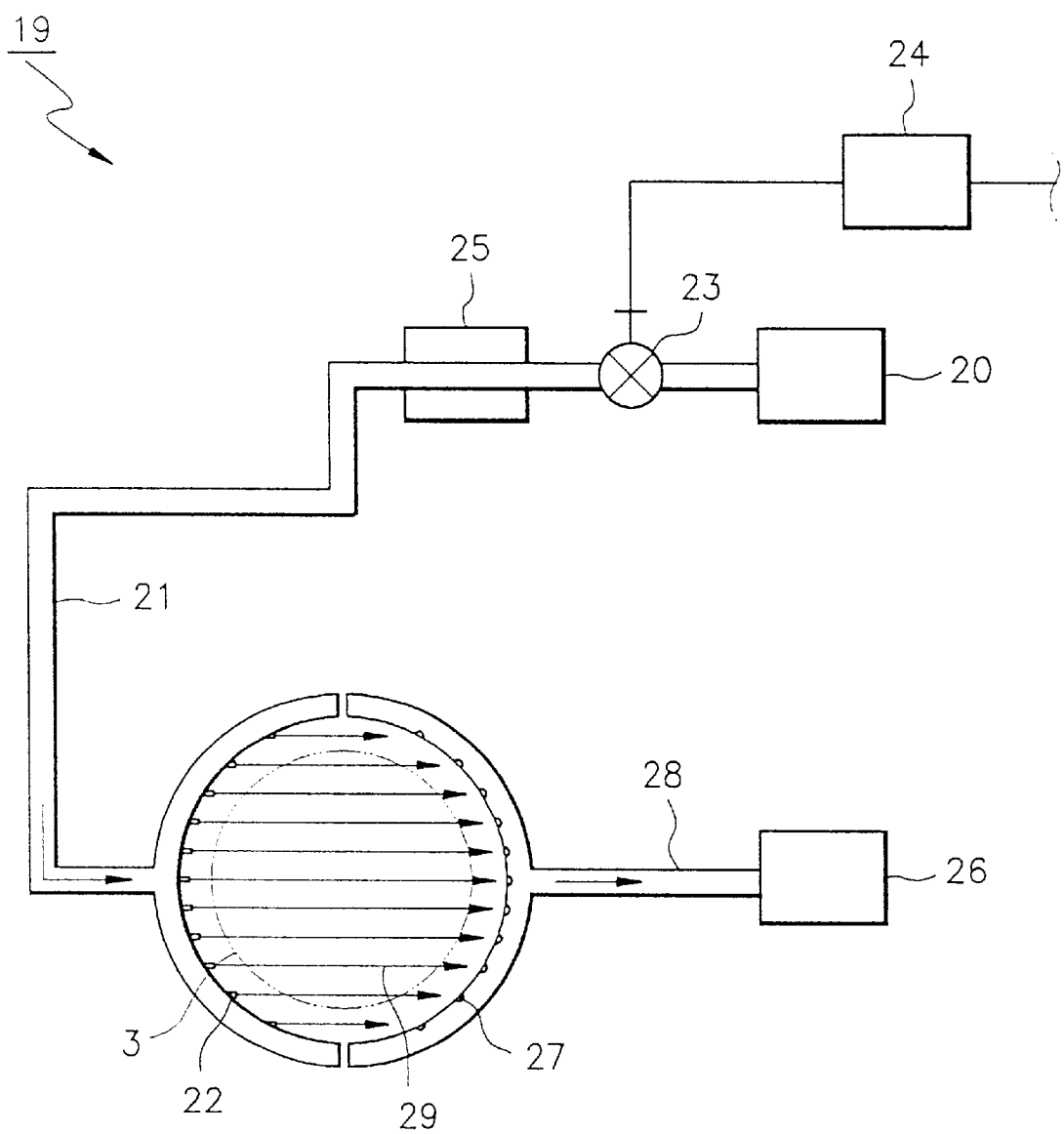
FIG. 6 is a plan view showing an air curtain apparatus according to another preferred embodiment of the present invention.

An air curtain apparatus 19 according to another embodiment of the present invention is described referring to FIG. 6. The air curtain apparatus 19 comprises a gas source 20 for storing gas at a high pressure, a gas supply line 21 in communication with the gas source 20, spray nozzles 22 for spraying a high pressure gas supplied through the gas supply line 21, an intake port 27 for taking in the gas sprayed through the spray nozzles 22, a gas valve 23 provided on the gas supply line 21 for opening/closing the gas supply line 21, which is controlled by an on/off signal from the controlling unit 24, and a preheater 25 provided on the gas supply line 21 for preheating the gas.

In addition, on the other side of the opening 3, there are provided a vacuum pump 26 a certain distance away from the intake port 27 for forming a vacuum pressure, and a gas intake line 28 connecting the vacuum pump 26 and the intake port 27.

Therefore, if the gas valve 23 is opened by the controlling unit 24, the gas is preheated by the preheater 25, and sprayed from the spray nozzle 22 via the gas supply line 21. The gas, which forms the air curtain 29, is taken in through the intake port 27, which is located across from the spray nozzle 22, and introduced into the vacuum pump 26 along the gas intake line 28. Therefore, a stable flow of the air curtain 29 can be facilitated. The air curtain 29 can be selectively removed upon receipt of an off-signal from the controlling unit 24 to close the gas valve 23.

Figure 7:
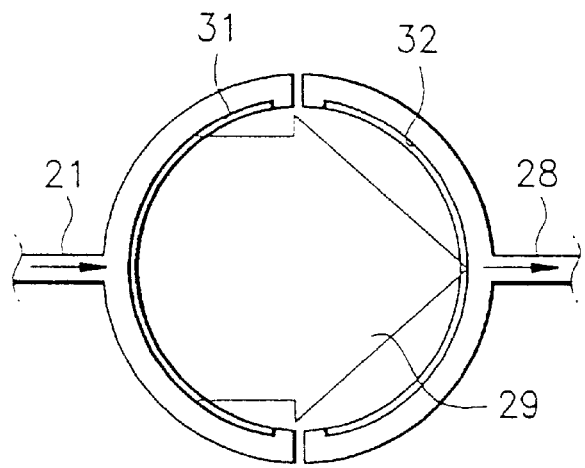
FIG. 7 is a plan view showing an alternative embodiment of the spray nozzle shown in FIG. 6.

Alternatively, instead of the spray nozzles 22 as shown in FIG. 6, a long, narrow slit-like spray nozzle 31 is formed on the end of the gas supply line 21 as shown in FIG. 7, and the gas sprayed under high pressure from the spray nozzle 31 is taken in through a long, narrow slit-like intake port 32 formed on the end of, and in communication with, the gas intake line 28. Therefore, the gas sprayed through the spray nozzle 31 forms an integrated flat plate-like air curtain 29 so as to form a more dense and stabilized gas flow. In addition, one of ordinary skill in the art would understand that the slit-like spray nozzle 31 and/or the slit-like intake port 32 can be combined with any of the nozzle arrangements described with reference to FIGS. 2–5.

Figure 8:
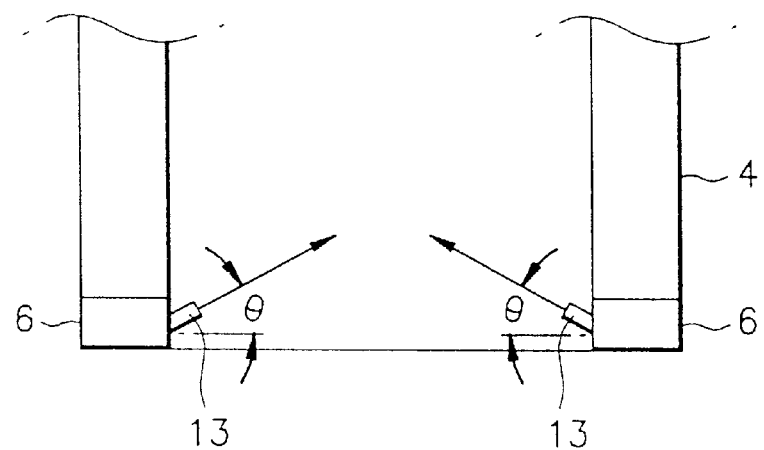
FIG. 8 is a side view showing the spray angle of the spray nozzle applied on the air curtain apparatus of the present invention.

Each of the various types of the spray nozzles 13, 16, 17, 18, 22, 31 as described above angles the air flow at a certain spray angle ($\theta$) toward the inside of the furnace 4, as shown in FIG. 8. This spray angle ($\theta$) is the angle between each of the spray nozzles 13, 16, 17, 18, 22, 31 and a planar surface crossing the opening 3, such that the gas is sprayed upward toward the inside the furnace 4 at that angle to prevent the heated air flow inside the furnace 4 from coming out.

The spray angle ($\theta$) is preferably between 0° to 45°. If the spray angle ($\theta$) is over 45°, a large amount of gas may be introduced into the inside the furnace 4, and if the spray angle ($\theta$) is less than 0°, the cut-off effect of the heated air flow is reduced. In other words, if the spray angle ($\theta$) is less than 0°, the air current is directed along the same direction as the heated air flow, which will undesirably facilitate drawing the heated air out of the furnace.

Figure 9:
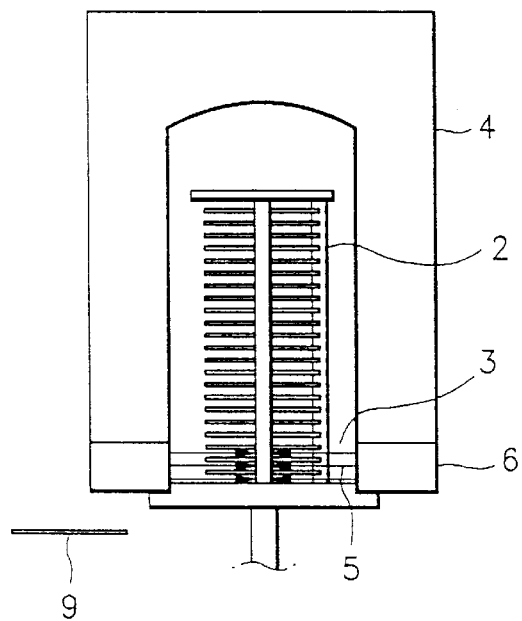

In operation, as shown in FIG. 9, after the diffusion process is completed inside the furnace 4, the air curtain apparatus 6 is operated by the signal from the controlling unit so as to form the air curtain 5 across the opening 3. At this time, the cut-off door 9 is maintained at a waiting position a certain distance away from the opening 3.

Figure 10:
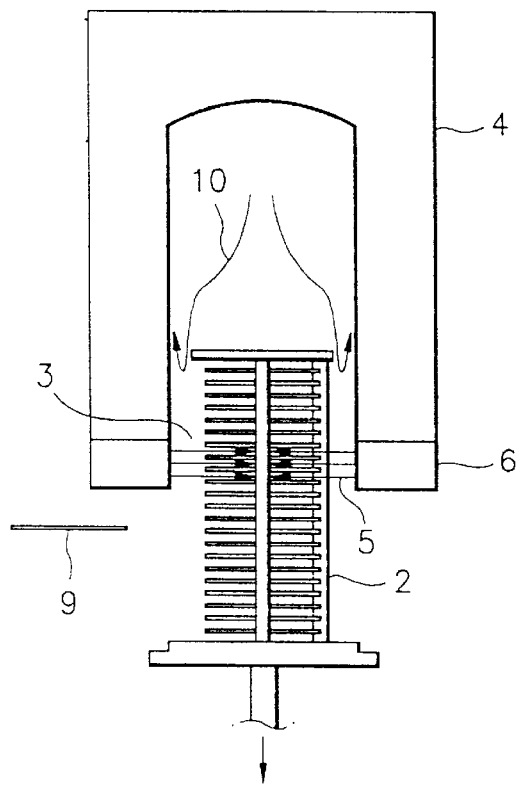

Then, with the air curtain 5 formed and maintained, the wafer boat 2 is moved out of the furnace 4 through the opening 3. At this time, the wafer boat 2 passes through the air curtain 5, and comes out of the furnace 4 with the air curtain 5 formed and maintained as shown in FIG. 10, but the heated air flow 10 inside the furnace 4 does not come out of the furnace 4 because of the presence of the air curtain 5 across the opening 3.

Figure 11:
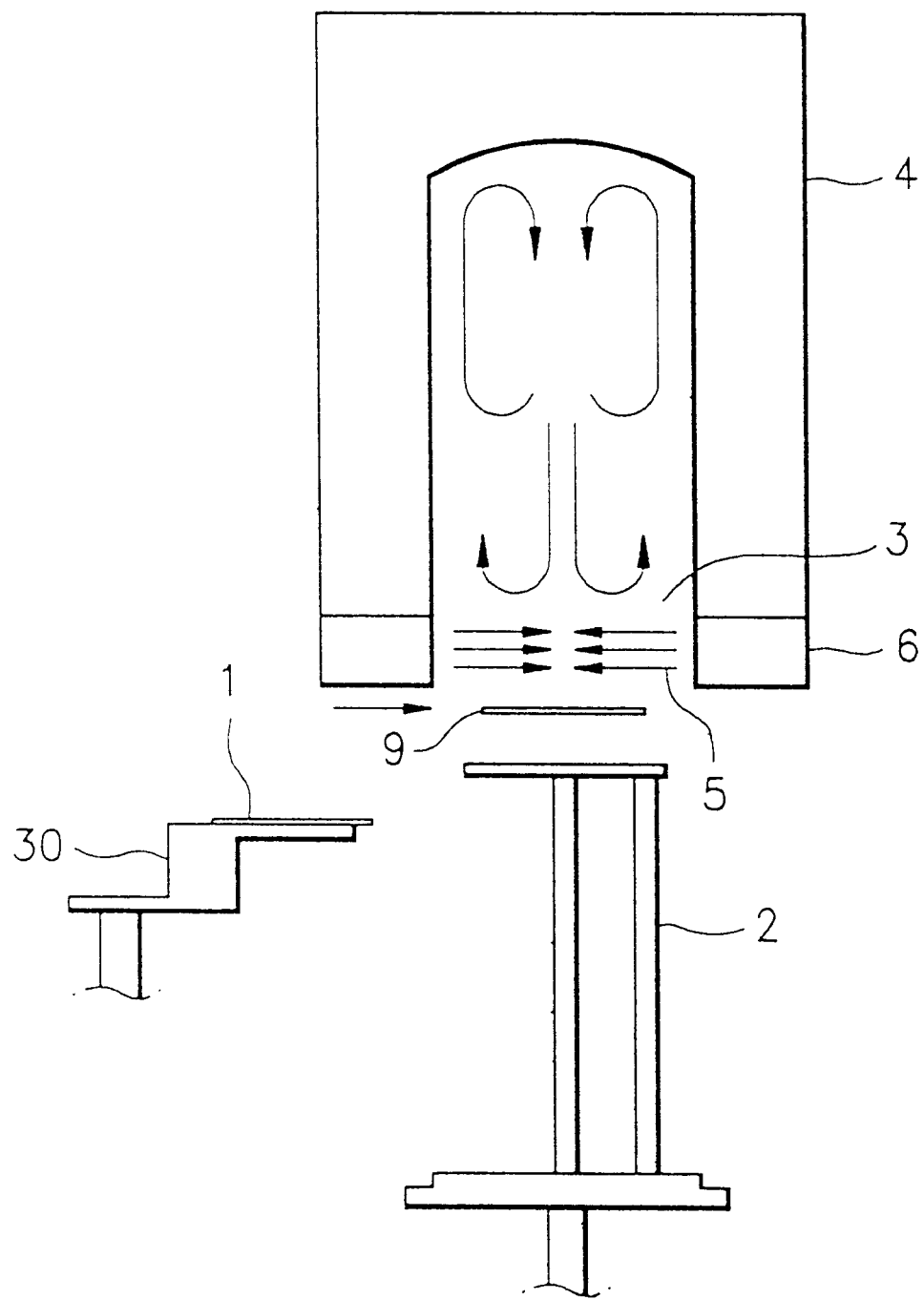

While the air curtain 5 is still present as shown in FIG. 11, the wafer 1 loaded in the wafer boat 2 is unloaded to a wafer transfer apparatus 30 to move to a subsequent process, and as shown in FIG. 12, a next set of wafers 1 to be processed are loaded in the wafer boat 2. At this time, the cut-off door 9 closes one part of the opening 3, thereby improving the cut-off effect of the air curtain 5.

Then, while the air curtain 5 is still present, and as the cut-off door 9 moves back to the waiting position, the wafer boat 2 is loaded into the inside of the furnace 4 as shown in FIG. 13. At this time, the wafer boat 2 passes through the air curtain 5, and goes into the furnace 4, but the outside air is blocked by the air curtain 5, and does not go into the furnace 4.

Finally, the wafer boat 2 is completely loaded into the inside of the furnace 4, and then, the air curtain apparatus 6 stops and the air curtain 5 is removed.

Then, a next round of the diffusion process is performed, and the operation shown in FIGS. 9 to 13 is repeated, such that a large number of wafers can be continuously processed.

Therefore, according to the present invention, the loss of the heat inside the furnace 4 can be effectively minimized, and it is not necessary to recover any lost heat around the opening 3. Further, the temperature load in the heaters can be reduced thereby increasing the life of the facility system. Also, one of ordinary skill in the art would understand that the size and function of the cut-off door 9 to cut off one portion of the opening 3 can be optimized.

FIG. 14 is a flow chart depicting the operation steps of the diffusion system having an air curtain formation function for manufacturing semiconductor devices according to the present invention. After the diffusion process is completed inside the furnace (S1), the air curtain apparatus forms the air curtain around the opening by the controlling unit (S2). Then, with the air curtain present, the wafer boat is unloaded out of the furnace (S3), and the wafers in the wafer boat are unloaded (S4). Then, new wafers to be introduced into the diffusion process are loaded into the wafer boat (S5), and the wafer boat is loaded into the furnace (S6). After the wafer boat is loaded into the furnace, the air curtain apparatus stops, and the air curtain is removed (S7).

Because the air curtain is formed when the opening is open, the loss of the heated air flow can be prevented. In addition, while the air curtain is formed, the amount of the sprayed gas can be minimized, and the spray amount of the gas can be controlled at each step. The above steps are repeatedly carried out according to the program preset into the controlling unit to control the system.

Therefore, according to the present invention, the temperature inside the furnace can be maintained uniformly, and the uniformity of the layers formed on the semiconductor substrates and the endurance of the furnace can be improved. Further, the time for the temperature recovery can be reduced, thereby increasing the productivity and the production yield of semiconductor devices.

While the present invention has been described in detail, it should be understood that various changes, substitutions and alterations can be made hereto without departing from the spirit and scope of the invention as defined by the appended claims.

What is claimed is:

1. A diffusion system comprising:
   a furnace having an opening through which a wafer boat is to pass to enter and leave the furnace;
   a plurality of spray nozzles disposed around said opening of the furnace and collectively operative to form a curtain of gas traversing said opening, said spray nozzles that are disposed around said opening consisting of a first set of spray nozzles confined to one circumferential half of said opening and spaced from one another in the circumferential direction of the opening, and a second set of spray nozzles confined to the other circumferential half of said opening and spaced from one another in the circumferential direction of the opening, said spray nozzles of said first and second sets being oriented to spray gas along respective lines all parallel to one another, and each of the spray nozzles of said first set being offset from each of the spray nozzles of said second set along a direction orthogonal to said parallel lines along which the gas is sprayed by the nozzles such that gas sprayed from the spray nozzles of each one of the sets passes alongside the gas sprayed from the spray nozzles of the other one of the sets while traversing said opening;
   a source of gas, and a gas supply line connecting said source of gas to said plurality of spray nozzles; and
   a control unit operative to establish and terminate a flow of gas from said source of gas to said spray nozzles through said gas supply line.

2. The diffusion system of claim 1, wherein said control unit comprises a valve disposed in said gas supply line.

3. The diffusion system of claim 2, wherein said control unit comprises a controller having a control program stored therein, said controller being operatively connected to said valve so as to issue signals to said valve, dictated by said control program, that selectively open and close said valve.

4. The diffusion system of claim 1, and further comprising a heater disposed in-line with said gas supply line so as to pre-heat the gas that is sprayed by aid spray nozzles.

5. A diffusion system comprising:
   a furnace having an opening through which a wafer boat is to pass to enter and leave the furnace;
   a plurality of spray nozzles disposed around said opening of the furnace, spaced from one another in the circumferential direction of said opening, and collectively operative to form a curtain of gas traversing said opening, all of the spray nozzles that are disposed around said opening being confined to at most one circumferential half of said opening and oriented to spray parallel lines of gas, such that gas sprayed from the spray nozzles forms gas flow lines which traverse the opening in one direction;
   a source of gas, and a gas supply line connecting said source of gas to said plurality of spray nozzles; and
   a control unit operative to establish and terminate a flow of gas from said source of gas to said spray nozzles through said gas supply line.

6. The diffusion system of claim 5, wherein said control unit comprises a valve disposed in said gas supply line.

7. The diffusion system of claim 6, wherein said control unit comprises a controller having a control program stored therein, said controller being operatively connected to said valve so as to issue signals to said valve, dictated by said control program, that selectively open and close said valve.

8. The diffusion system of claim 5, and further comprising a heater disposed in-line with said gas supply line so as to pre-heat the gas that is sprayed by aid spray nozzles.

9. A diffusion system comprising:
   a furnace having an opening through which a wafer boat is to pass to enter and leave the furnace;

a plurality of groups of spray nozzles disposed around said opening of the furnace and collectively operative to form a curtain of gas traversing said opening, the spray nozzles of each said group being spaced from one another in the circumferential direction of the opening and oriented to spray parallel lines of gas, and the spray nozzles of each one of said groups being oriented to spray gas in a direction orthogonal to the direction along which the spray nozzles of another of said groups sprays gas such that the gas sprayed across the opening by said groups of nozzles forms traces which together are lattice-shaped;

a source of gas, and a gas supply line connecting said source of gas to said plurality of spray nozzles; and a control unit operative to establish and terminate a flow of gas from said source of gas to said spray nozzles through said gas supply line.

10. The diffusion system of claim 9, wherein said control unit comprises a valve disposed in said gas supply line.

11. The diffusion system of claim 10, wherein said control unit comprises a controller having a control program stored therein, said controller being operatively connected to said valve so as to issue signals to said valve, dictated by said control program, that selectively open and close said valve.

12. The diffusion system of claim 9, and further comprising a heater disposed in-line with said gas supply line so as to pre-heat the gas that is sprayed by aid spray nozzles.

13. A diffusion system comprising:

a furnace having an opening through which a wafer boat is to pass to enter and leave the furnace, said opening lying in a plane;

a plurality of spray nozzles disposed around said opening of the furnace and collectively operative to form a curtain of gas traversing said opening, each of said spray nozzles being oriented to spray gas in a direction toward the interior of said furnace along a line subtending an angle greater than 0° and no more than 45° with said plane such that the gas is sprayed into the furnace at said angle relative to the plane of said opening;

a source of gas, and a gas supply line connecting said source of gas to said plurality of spray nozzles; and a control unit operative to establish and terminate a flow of gas from said source of gas to said spray nozzles through said gas supply line.

14. The diffusion system of claim 13, wherein said control unit comprises a valve disposed in said gas supply line.

15. The diffusion system of claim 14, wherein said control unit comprises a controller having a control program stored therein, said controller being operatively connected to said valve so as to issue signals to said valve, dictated by said control program, that selectively open and close said valve.

16. The diffusion system of claim 13, and further comprising a heater disposed in-line with said gas supply line so as to pre-heat the gas that is sprayed by aid spray nozzles.

* * * * *